United States Patent
Mochizuki

(10) Patent No.: US 7,876,801 B2
(45) Date of Patent: Jan. 25, 2011

(54) SURFACE-EMITTING TYPE SEMICONDUCTOR LASER

(75) Inventor: Masamitsu Mochizuki, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 12/503,397

(22) Filed: Jul. 15, 2009

(65) Prior Publication Data

US 2009/0274186 A1 Nov. 5, 2009

Related U.S. Application Data

(62) Division of application No. 11/832,005, filed on Aug. 1, 2007, now Pat. No. 7,580,438.

(30) Foreign Application Priority Data

Aug. 2, 2006 (JP) ............... 2006-211245

(51) Int. Cl.
H01S 5/00 (2006.01)

(52) U.S. Cl. ............... 372/50.124; 372/43.01; 372/50.23; 372/99; 372/101

(58) Field of Classification Search ............ 372/43.01, 372/50.124, 50.23, 99, 101
See application file for complete search history.

(56) References Cited

U.S. PATENT DOCUMENTS

| | | | |
|---|---|---|---|
| 5,084,895 A | 1/1992 | Shimada et al. | |
| 5,822,356 A | 10/1998 | Jewell | |
| 7,199,939 B2 | 4/2007 | Ohkubo et al. | |
| 7,352,787 B2 | 4/2008 | Mukoyama et al. | |
| 7,580,438 B2 * | 8/2009 | Mochizuki | 372/50.23 |
| 2002/0044582 A1 | 4/2002 | Kondo | |
| 2003/0076598 A1 | 4/2003 | Kittaka et al. | |
| 2004/0091010 A1 | 5/2004 | Choquette et al. | |
| 2006/0083282 A1 * | 4/2006 | Kondo | 372/50.124 |
| 2006/0093008 A1 | 5/2006 | Mochizuki | |
| 2006/0146662 A1 | 7/2006 | Ohkubo et al. | |
| 2007/0103912 A1 | 5/2007 | Namii | |
| 2007/0253048 A1 | 11/2007 | Sakai et al. | |
| 2008/0279060 A1 * | 11/2008 | Nishi et al. | 369/44.37 |

FOREIGN PATENT DOCUMENTS

| | | | |
|---|---|---|---|
| JP | 2000-076682 | | 3/2000 |
| JP | 2005-150505 | | 6/2005 |
| JP | 2006-054489 | | 2/2006 |
| JP | 2006-128548 | * | 5/2006 |
| JP | 2008-04177 | * | 2/2008 |

* cited by examiner

Primary Examiner—Tod T Van Roy
Assistant Examiner—Delma R Forde
(74) Attorney, Agent, or Firm—Harness, Dickey & Pierce, P.L.C.

(57) ABSTRACT

A surface-emitting type semiconductor laser includes: a lower mirror; an active layer formed above the lower mirror; an upper mirror formed above the active layer; and a lens section formed above the upper mirror, wherein $n_1 > n$, where $\lambda$ is a design wavelength, $n_1$ is a refractive index of a topmost layer of the upper mirror with respect to light of the design wavelength, and n is a refractive index of the lens section with respect to light of the design wavelength, the lens section has a thickness of $\lambda/2n$ at an anti-node of the zeroth order resonance mode component among light resonating in the active layer, and the lens section has a thickness of $\lambda/4n$ at at least a portion of an anti-node of the first order resonance mode component among the light resonating in the active layer.

1 Claim, 5 Drawing Sheets

SURFACE-EMITTING TYPE SEMICONDUCTOR LASER

This application is a divisional of U.S. patent application Ser. No. 11/832,005 filed on Aug. 1, 2007. This application claims the benefit of Japanese Patent Application No. 2006-211245 filed Aug. 2, 2006. The disclosures of the above applications are incorporated herein by reference.

The entire disclosure of Japan Patent Application No. 2006-211245, filed Aug. 2, 2006 is expressly incorporated by reference herein.

BACKGROUND

1. Technical Field

Several aspects of the present invention relate to surface-emitting type semiconductor lasers.

2. Related Art

Surface-emitting type semiconductor lasers are greatly attracting attention as inexpensive and high performance light sources. Above all, a surface-emitting type semiconductor laser with a lens section is hoped for a structure that can maintain the emission angle small, while generating a high power. For example, Japanese laid-open patent application JP-A-2000-76682 is an example of related art.

SUMMARY

In accordance with an advantage of some aspects of the invention, high-order modes of a surface-emitting type semiconductor laser with a lens section can be cut or reduced, and a higher power output thereof can be achieved.

In accordance with an embodiment of the invention, a first surface-emitting type semiconductor laser includes:
 a lower mirror;
 an active layer formed above the lower mirror;
 an upper mirror formed above the active layer; and
 a lens section formed above the upper mirror,
 wherein $n_1 > n$, where $\lambda$ is a design wavelength, $n_1$ is a refractive index of a topmost layer of the upper mirror with respect to light of the design wavelength, and $n$ is a refractive index of the lens section with respect to light of the design wavelength,
 the lens section has a thickness of $\lambda/2n$ at an anti-node of the zeroth order resonance mode component among light resonating in the active layer, and
 the lens section has a thickness of $\lambda/4n$ at at least a portion of an anti-node of the first order resonance mode component among the light resonating in the active layer.

By the surface-emitting type semiconductor laser in accordance with the invention, the first resonance mode component (a high resonance mode component) can be cut or reduced, and a higher output can be achieved. This is also confirmed by numerical calculation examples to be described below.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case in which "B" is formed directly on "A," and a case in which "B" is formed over "A" through another member on "A."

Also, in the invention, the "design wavelength" is a wavelength of light that has the maximum intensity among light generated in the surface-emitting type semiconductor laser.

Also, in the invention, the "first resonance mode component" means a resonance mode component that oscillates next to the lowest order mode component. Also, in the invention, the order of mode (the zeroth order and the first order) means the order in a transverse direction.

In accordance with an embodiment of the invention, a second surface-emitting type semiconductor laser includes:
 a lower mirror;
 an active layer formed above the lower mirror;
 an upper mirror formed above the active layer; and
 a lens section formed above the upper mirror,
 wherein $n_1 < n$, where $\lambda$ is a design wavelength, $n_1$ is a refractive index of a topmost layer of the upper mirror with respect to light of the design wavelength, and $n$ is a refractive index of the lens section with respect to light of the design wavelength,
 the lens section has a thickness of $3\lambda/4n$ at an anti-node of the zeroth order resonance mode component among light resonating in the active layer, and
 the lens section has a thickness of $\lambda/2n$ at at least a portion of an anti-node of the first order resonance mode component among the light resonating in the active layer.

In the surface-emitting type semiconductor laser in accordance with an aspect of the invention, normalized energy of the active layer with the zeroth order resonance mode component may be greater than normalized energy of the active layer with the first order resonance mode component.

In accordance with an embodiment of the invention, a third surface-emitting type semiconductor laser includes:
 a lower mirror;
 an active layer formed above the lower mirror;
 an upper mirror formed above the active layer; and
 a lens section formed above the upper mirror, wherein at least one of the lower mirror and the upper mirror has a current constricting layer,
 a plane configuration of the lens section and a plane configuration of an aperture of the current constricting layer are concentric circles,
 $n_1 > n$, where $\lambda$ is a design wavelength, $n_1$ is a refractive index of a topmost layer of the upper mirror with respect to light of the design wavelength, and $n$ is a refractive index of the lens section with respect to light of the design wavelength,
 the lens section has a thickness of $\lambda/2n$ at a center of the plane configuration of the lens section,
 the lens section has a thickness of $\lambda/4n$ at a circumference of a circle with a radius R that is concentric with the plane configuration of the lens section, and
 the radius R is expressed by Formula (1) below, $$R = (r_1/r_2)\, a \quad (1)$$

where $r_1$ is a position of the first anti-node of a first order Bessel function of the first kind $J_1(r)$,
 $r_2$ is a position of the first node of $J_1(r)$, and
 $a$ is a radius of the aperture section of the current constricting layer.

In accordance with an embodiment of the invention, a fourth surface-emitting type semiconductor laser includes:
 a lower mirror;
 an active layer formed above the lower mirror;
 an upper mirror formed above the active layer; and
 a lens section formed above the upper mirror, wherein at least one of the lower mirror and the upper mirror has a current constricting layer,
 a plane configuration of the lens section and a plane configuration of an aperture of the current constricting layer are concentric circles, $n_1 < n$, where $\lambda$ is a design wavelength, $n_1$ is a refractive index of a topmost layer of the upper mirror with respect to light of the design wavelength, and n is a refractive index of the lens section with respect to light of the design wavelength, the lens section has a thickness of $3\lambda/4n$ at a center of the plane configuration of the lens section, the lens section has a thickness of $\lambda/2n$ at a circumference of a circle with a radius R that is concentric with the plane configuration of the lens section, and the radius R is expressed by Formula (1) below, $$R=(r_1/r_2)\,a \qquad (1)$$

where $r_1$ is a position of the first anti-node of a first order Bessel function of the first kind $J_1(r)$, $r_2$ is a position of the first node of $J_1(r)$, and a is a radius of the aperture section of the current constricting layer.

In accordance with an embodiment of the invention, a fifth surface-emitting type semiconductor laser includes:

a lower mirror;

an active layer formed above the lower mirror;

an upper mirror formed above the active layer; and a lens section formed above the upper mirror, wherein at least one of the lower mirror and the upper mirror has a current constricting layer, the current constricting layer has an aperture section whose plane configuration is in a rectangular shape that is concentric with a plane configuration of the lens section and has a first side having a length a and a second side having a length b, $n_1 > n$, where $\lambda$ is a design wavelength, $n_1$ is a refractive index of a topmost layer of the upper mirror with respect to light of the design wavelength, and n is a refractive index of the lens section with respect to light of the design wavelength, the lens section has a thickness of $\lambda/2n$ at a center of the plane configuration of the lens section, the lens section has, as viewed in a plan view, a thickness of $\lambda/4n$ at at least a portion at a distance of b/4 from a center line along the first side of the aperture section, and the lens section has, as viewed in a plan view, a thickness of $\lambda/4n$ at at least a portion at a distance of a/4 from a center line along the second side of the aperture section.

In accordance with an embodiment of the invention, a sixth surface-emitting type semiconductor laser includes:

a lower mirror;

an active layer formed above the lower mirror;

an upper mirror formed above the active layer; and a lens section formed above the upper mirror, wherein at least one of the lower mirror and the upper mirror has a current constricting layer, the current constricting layer has an aperture section whose plane configuration is in a rectangular shape that is concentric with a plane configuration of the lens section and has a first side having a length a and a second side having a length b, $n_1 < n$, where $\lambda$ is a design wavelength, $n_1$ is a refractive index of a topmost layer of the upper mirror with respect to light of the design wavelength, and n is a refractive index of the lens section with respect to light of the design wavelength, the lens section has a thickness of $3\lambda/4n$ at a center of the plane configuration of the lens section, the lens section has, as viewed in a plan view, a thickness of $\lambda/2n$ at at least a portion at a distance of b/4 from a center line along the first side of the aperture section, and the lens section has, as viewed in a plan view, a thickness of $\lambda/2n$ at at least a portion at a distance of a/4 from a center line along the second side of the aperture section.

DESCRIPTION OF EXEMPLARY EMBODIMENTS

Preferred embodiments of the invention are described below with reference to the accompanying drawings.

1. First, a surface-emitting type semiconductor laser (hereafter also referred to as a "surface-emitting laser") 100 in accordance with an embodiment of the invention is described.

Figure 1:
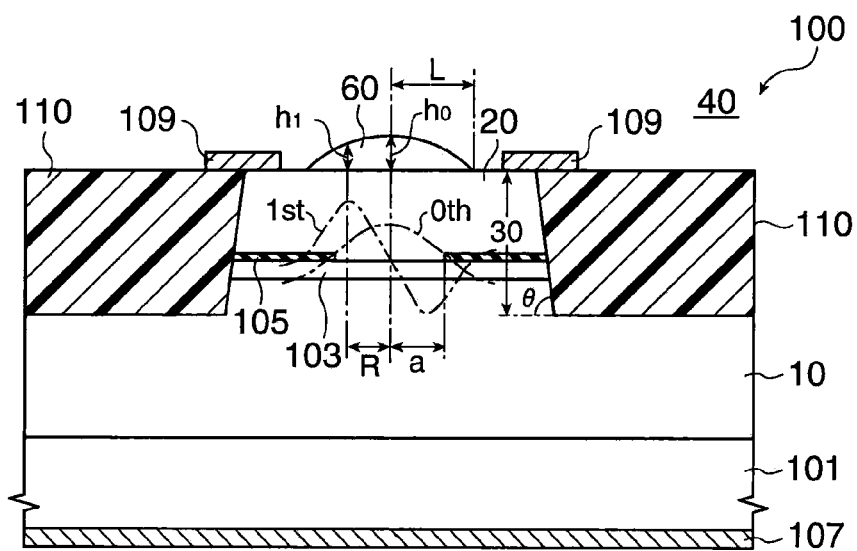
FIG. 1 is a schematic cross-sectional view of a surface-emitting laser in accordance with an embodiment of the invention.
Figure 2:
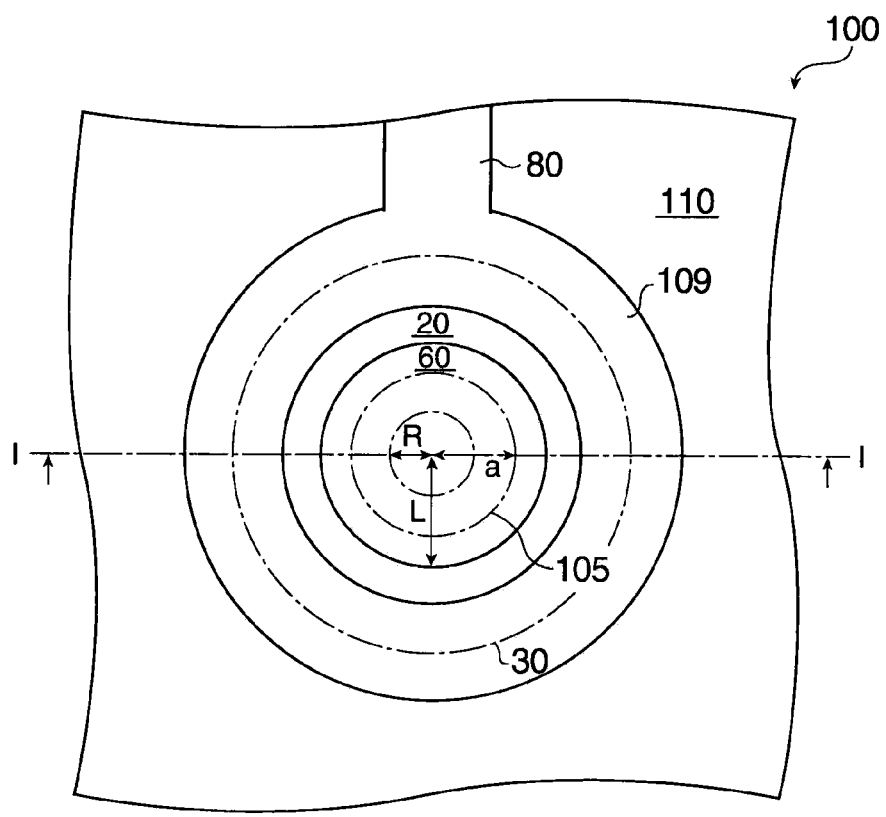
FIG. 2 is a schematic plan view of the surface-emitting laser in accordance with the present embodiment.

FIG. 1 is a schematic cross-sectional view of the surface-emitting laser 100, and FIG. 2 is a schematic plan view of the surface-emitting laser 100. It is noted that FIG. 1 is a cross-sectional view taken along line I-I of FIG. 2.

The surface-emitting laser 100 may include, as shown in FIG. 1, a substrate 101, a lower mirror 10, an active layer 103, an upper mirror 20, a lens section 60, a dielectric layer 110, a first electrode 107 and a second electrode 109.

As the substrate 101, for example, a first conductivity type (for example, n-type) GaAs substrate may be used.

The lower mirror 10 of, for example, the first conductivity type is formed on the substrate 101. The lower mirror 10 may be, for example, a distributed Bragg reflection type (DBR) mirror of alternately laminated lower and higher refractive index layers. The lower refractive index layers may be formed from, for example, n-type $Al_{0.9}Ga_{0.1}As$ layers (with a refractive index being 3.049), respectively. The higher refractive index layers may be formed from, for example, n-type $Al_{0.15}Ga_{0.85}As$ layers (with a refractive index being 3.525), respectively. For example, 37.5 pairs each composed of the lower and higher refractive index layers are laminated to form the lower mirror 10.

The active layer 103 is formed on the lower mirror 10. The active layer 103 has a multiple quantum well (MQW) structure in which quantum well structures each formed from, for example, a GaAs well layer and an $Al_{0.2}Ga_{0.8}As$ barrier layer are laminated in three layers. For example, the active layer 103 may not be doped with an impurity.

The upper mirror 20 of, for example, a second conductivity type (for example, p-type) is formed on the active layer 103. The upper mirror 20 may be, for example, a distributed Bragg reflection type (DBR) mirror of alternately laminated lower and higher refractive index layers. The lower refractive index layers may be formed from, for example, p-type $Al_{0.9}Ga_{0.1}As$ layers (with a refractive index being 3.049), respectively. The higher refractive index layers may be formed from, for example, p-type $Al_{0.15}Ga_{0.85}As$ layers (with a refractive index being 3.525), respectively. For example, 25 pairs each composed of the lower and higher refractive index layers are laminated to form the upper mirror 20.

The lower mirror 10, the active layer 103 and the upper mirror 20 can form a vertical resonator. The composition and the number of layers composing the lower mirror 10, the active layer 103 and the upper mirror 20 may be appropriately adjusted according to the necessity. The upper mirror 20, the active layer 103 and a portion of the lower mirror 10 may form a columnar semiconductor laminate (hereafter referred to as a "columnar section") 30. The columnar section 30 has a plane configuration that may be, for example, a circular shape, for example, shown in FIG. 2.

Also, for example, at least one of the layers composing at least one of the lower mirror 10 and the upper mirror 20 can be formed as a current constricting layer 105. In the example shown in FIG. 1 and FIG. 2, the current constricting layer 105 is a layer composed the upper mirror 20, and formed in a region near the active layer 103. As the current constricting layer 105, for example, an oxidized AlGaAs layer or a layer implanted with protons can be used. The current constricting layer 105 is a dielectric layer having an aperture section, and is formed in a ring shape. The aperture section of the current constricting layer 105 has a plane configuration that may be, for example, a circular shape shown in, for example, FIG. 2. When the optical mode is determined by a current path (in the case of a gain guide), for example, when a proton implanted layer is used as the current constricting layer 105, the second electrode 109 to be described below may also preferably have a circular plane configuration.

The lens section 60 is formed on the upper mirror 20. The upper surface of the lens section 60 may have a convex lens shape, for example, as shown in FIG. 1. The shape of the lens section 60 may be a shape in which a portion of a sphere is cut and removed, or a shape in which a portion of an ellipsoid of revolution is cut and removed. The lens section 60 has a plane configuration that is, for example, a circular shape, an elliptical shape, or a rectangular shape (including a square or a rectangle). In the surface-emitting laser 100 in accordance with the present embodiment, laser light may be emitted from the upper surface of the lens section 60. The lens section 60 may be composed of a material through which at least a part of the laser light can pass. The lens section 60 may be composed of, for example, semiconductor material, dielectric material, or nonmetal material such as resin. The lens section 60 may be composed of, for example, AlGaAs.

In the surface-emitting laser 100 in accordance with the present embodiment, a refractive index $n_1$ of the topmost layer of the upper mirror 20 with respect to a design wavelength $\lambda$ may be made greater than, for example, a refractive index n of the lens section 60 with respect to the design wavelength $\lambda$. In this case, the thickness $h_0$ of the lens section 60 at an anti-node of the zeroth order resonance mode component (hereafter referred to as the "zeroth order mode") among light resonating in the active layer 103 is $\lambda/2n$. Further, the thickness $h_1$ of the lens section 60 at an anti-node of the first order resonance mode component (hereafter referred to as the "first order mode") among the light resonating in the active layer 103 is $\lambda/4n$. It is noted that, in FIG. 1, the zeroth order mode is shown abbreviated as "$0^{th}$," and the first order mode as "$1^{st}$."

For example, when the plane configuration of the lens section 60 and the plane configuration of the aperture section of the current constricting layer 105 are concentric circles, the anti-node of the zeroth order mode is located at the center of the plane configuration, as shown in FIG. 1 and FIG. 2. Furthermore, the anti-node of the first order mode is located on a circumference of a circle with a radius R, and is concentric with the plane configuration of the lens section 60, as viewed in a plan view. The radius R is expressed by Formula (1) below.

$$R = (r_1/r_2) a \quad (1)$$

It is noted that $r_1$ is a position of the first anti-node of a first order Bessel function of the first kind $J_1(r)$, $r_2$ is a position of the first node of $J_1(r)$, and a is a radius of the aperture section of the current constricting layer 105. Formula (1) above can be obtained as follows.

The electric field distribution (in-plane component) of the first order mode of the surface-emitting laser 100 may be approximated by the mode of an optical fiber, and expressed as, for example, $$E_r(r, \theta) = E_0 J_1(ur/a) \sin \theta \quad (2)$$

It is noted that $E_0$ is the amplitude at r=0, and u is expressed by Formula (3) below.

$$u = a\sqrt{k_0^2 n_c^2 - \beta^2} \quad (3)$$

It is noted that $k_0$ is a wavenumber in vacuum, $n_c$ is a refractive index of a core (the inner side of the current constricting layer 105) section, and $\beta$ is a propagation constant (a wavenumber component in the device in its vertical direction).

In the surface-emitting laser 100, the optical mode is determined by the current constricting layer 105, such that a node occurs at r=a. Accordingly, in the case of the first order mode, when r=a in Formula (2) above, the value "ur/a" in the brackets should match with the first zeroth point $r_2$ of $J_1$. Therefore, the following relation is established.

$$r_2 = ua/a = u \quad (4)$$

Similarly, when the first order mode has an anti-node at r=R, the value "ur/a" in the brackets in Formula (2) above should match with the first anti-node $r_1$ of $J_1$. Therefore the following relation is established.

$$r_1 = uR/a \quad (5)$$

By assigning "$u=r_2$" given by Formula (4) above to Formula (5) above, the position R of the anti-node of the first order mode is given as, $$R = (r_1/r_2)a \quad (1)$$

It is noted that values of the first order Bessel function of the first kind can be used for $r_1$ and $r_2$, wherein $r_1$ is about 1.841, and $r_2$ is about 3.832. Therefore, Formula (1) above can be expressed as, $$R \approx 0.480 \, a \quad (1')$$

For example, when the radius a of the aperture section of the current constricting layer 105 is 6.5 μm, the position R of the anti-node of the first order mode is about 3.12 μm.

The first electrode 107 is formed at the back surface (the surface on the opposite side of the lower mirror 10) of the substrate 101. The first electrode 107 is electrically connected to the lower mirror 10 through the substrate 101. The first electrode 107 may be formed, for example, on the top surface of the lower mirror 10.

The second electrode 109 is formed on the second mirror 20 and the dielectric layer 110. The second electrode 109 is electrically connected to the upper mirror 20. The second electrode has a plane configuration that may be, for example, a ring shape. The second electrode 109 has an aperture section on the columnar section 30. The aperture section has a plane configuration that may be a circular shape shown, for example, in FIG. 2. The second electrode 109 is connected with, for example, one end of a lead-out wire 80. The other end of the lead-out wire 80 may be connected with, for example, an electrode pad (not shown).

The dielectric layer 110 is formed on the lower mirror 10. The dielectric layer 110 is formed in a manner to surround the columnar section 30. The dielectric layer 110 can electrically isolate the second electrode 109 from the lower mirror 10.

2. Next, an example of a method for manufacturing a surface-emitting laser 100 in accordance with an embodiment of the invention is described with reference to the accompanying drawings.

Figure 3:
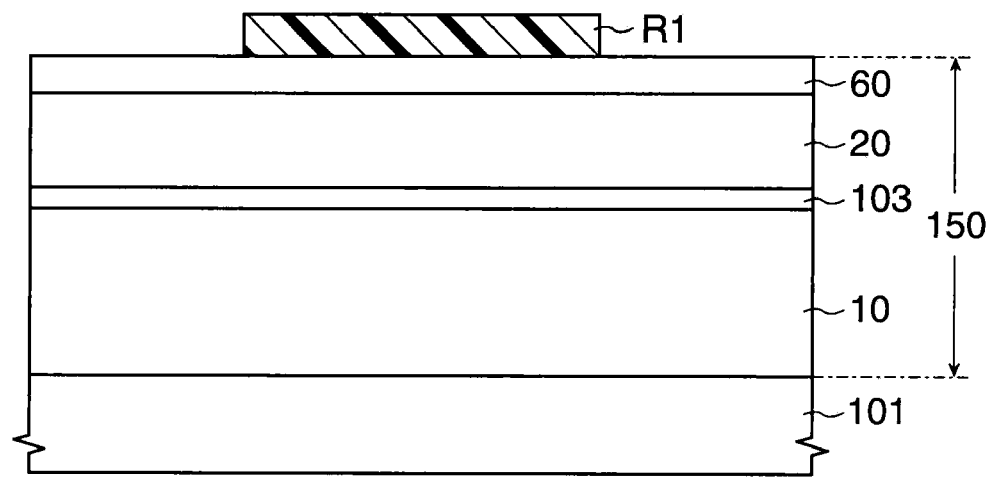
FIG. 3 is a cross-sectional view schematically showing a step in a method for manufacturing a surface-emitting laser in accordance with an embodiment of the invention.
Figure 4:
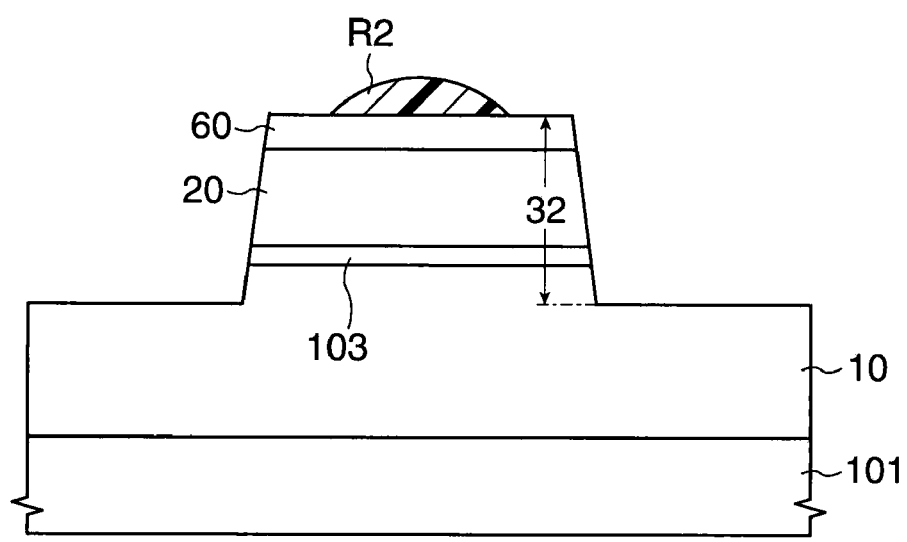
FIG. 4 is a cross-sectional view schematically showing a step in the method for manufacturing a surface-emitting laser in accordance with the present embodiment.

FIG. 3 and FIG. 4 are cross-sectional views schematically showing a process for manufacturing the surface-emitting laser 100 in accordance with the present embodiment shown in FIG. 1 and FIG. 2.

(1) First, as shown in FIG. 3, for example, an n-type GaAs substrate is prepared as a substrate 101. Next, on the substrate 101 composed, a semiconductor multilayer film 150 is formed by epitaxial growth while modifying its composition. The multilayer film 150 is composed of semiconductor layers successively laminated for forming a lower mirror 10, an active layer 103, an upper mirror 20, and a lens section 60. It is noted that, for example, when growing the upper mirror 20, at least one layer thereof adjacent to the active layer 103 may be formed as a layer that is later oxidized and becomes an oxidized constricting layer 105. As the layer to be oxidized, for example, an AlGaAs layer with its Al composition being 0.95 or higher may be used.

Next, as shown in FIG. 3, a first resist layer R1 having a predetermined pattern is formed on the semiconductor multilayer film 150 by using a lithography technique.

(2) Next, the semiconductor layers composing a portion of the lower mirror 10, the active layer 103, the upper mirror 20, and the lens section 60 are etched by using the first resist layer R1 as a mask, whereby a columnar semiconductor laminate 32 is formed, as shown in FIG. 4.

Next, the first resist layer R1 is heated and reflowed. In other words, the first resist layer R1 that is melted is flowed. By this, the first resist layer R1 is formed into a convex lens shape as shown in FIG. 4 by the influence of surface tension, whereby a second resist layer R2 is formed.

(3) Next, the second resist layer R2 and the lens section 60 are etched to shape the upper surface of the lens section 60 in a convex lens shape, as shown in FIG. 1 and FIG. 2. In this etching step, the convex lens shape can be transferred to the lens section 60, while reflecting the shape prior to the etching step of the second resist layer R2. Also, in the present etching step, the lower mirror 10, the active layer 103 and the upper mirror 20 are also etched. By this, a columnar section 30 in a desired configuration can be formed, as shown in FIG. 1 and FIG. 2.

(4) Next, by placing the substrate 101 on which the columnar section 30 is formed through the aforementioned steps in a water vapor atmosphere at, for example, about 400° C., the aforementioned layer to be oxidized is oxidized from its side surface, thereby forming a current constricting layer 105, as shown in FIG. 1 and FIG. 2. It is noted that the current constricting layer 105 may also be formed by implanting protons.

Next, as shown in FIG. 1 and FIG. 2, a dielectric layer 110 is formed on the lower mirror 10 in a manner to surround the columnar section 30. First, by using, for example, a spin coat method, a dielectric layer composed of polyimide resin or the like is formed over the entire surface. Then, the top surface of the columnar section 30 is exposed by using, for example, a CMP method. Next, by using, for example, a lithography technique and an etching technique, the dielectric layer is patterned. In this manner, the dielectric layer 110 in a desired configuration can be formed.

(5) As shown in FIG. 1 and FIG. 2, a first electrode 107 and a second electrode 109 are formed. These electrodes may be formed in a desired configuration by using a combination of a vacuum deposition method and a lift-off method. It is noted that the order of forming the electrodes is not particularly limited.

(6) By the steps described above, the surface-emitting laser 100 in accordance with the present embodiment can be obtained, as shown in FIG. 1 and FIG. 2.

3. Next, numerical calculation examples are described. For the numerical calculation, two-dimensional finite-difference time-domain method (FDTD method) was used.

First, while changing the thickness $h_0$ of the lens section 60 at the center of its plane configuration, the energy within the active layer 103 in the zeroth order mode and the first order mode was calculated. The energy of the active layer 103 was normalized for each mode based on the energy value that may be given when the lens section 60 is not provided. In other words, the energy of the active layer 103 in the zeroth order mode is presented by a value given by dividing itself by the energy in the zeroth order mode given in a state without the lens section 60 being provided, and the energy of the active layer 103 in the first order mode is presented by a value given by dividing itself by the energy in the first order mode given in a state without the lens section 60 being provided. In the embodiment of the invention, the energy of the active layer 103 after normalization is called the "normalized energy of the active layer." Also, the calculation was conducted with a gain isotropically added to the active layer 103 in order that light reflected diagonally at the lens section 60 and returned to the active layer 103 is also amplified. It is noted that, the smaller the outer diameter of the plane configuration of the lens section 60, the easier the light at the core (the inner side of the current constricting layer 105) hits the sloped portion of the lens section 60, such that light components reflecting diagonally at the lens section 60 would increase.

Each of the samples had the following structure.

The substrate 101: an n-type GaAs substrate (with a refractive index being 3.62)

Each pair in the lower mirror 10: an n-type $Al_{0.9}Ga_{0.1}As$ layer (with a refractive index being 3.049) and an n-type $Al_{0.15}Ga_{0.85}As$ layer (with a refractive index being 3.525) formed thereon.

The thickness of each pair in the lower mirror 10: 129.981 nm

The number of pairs in the lower mirror 10: 37.5 pairs

The active layer 103: a layer with 3 QW structure in which quantum well structures each formed from a GaAs well layer (with a refractive index being 3.6201) and an $Al_{0.2}Ga_{0.8}As$ layer (with a refractive index being 3.4294) are laminated in three layers.

The thickness of the active layer 103: 251.195 nm

Each pair in the upper mirror 20: a p-type $Al_{0.9}Ga_{0.1}As$ layer (with a refractive index being 3.049) and a p-type $Al_{0.15}Ga_{0.85}As$ layer (with a refractive index being 3.525) formed thereon.

The thickness of each pair in the upper mirror 20: 129.981 nm

The number of pairs in the upper mirror 20: 25 pairs

The topmost layer of the upper mirror 20: a p-type $Al_{0.15}Ga_{0.85}As$ layer (with a refractive index $n_1$ being 3.525)

The lens section 60: an $Al_{0.9}Ga_{0.1}As$ layer (with a refractive index being 3.049)

The plane configuration of the lens section 60: circular shape

The dielectric layer 110: polyimide resin (with a refractive index being 1.78)

External space 40 around the surface-emitting laser 100: air (with a refractive index being 1.00)

The slope of the columnar section 30 (slope of the post) θ: 80 degrees

The outside diameter (diameter) of the columnar section 30 in a plan view: about 50 μm The number of pairs in the lower mirror 10 at the columnar section 30: 4 pairs The current constricting layer 105: an oxidized AlGaAs layer in the first layer on the active layer 103 (with a refractive index being 1.6)

The thickness of the current constricting layer 105: 30 nm

Figure 5:
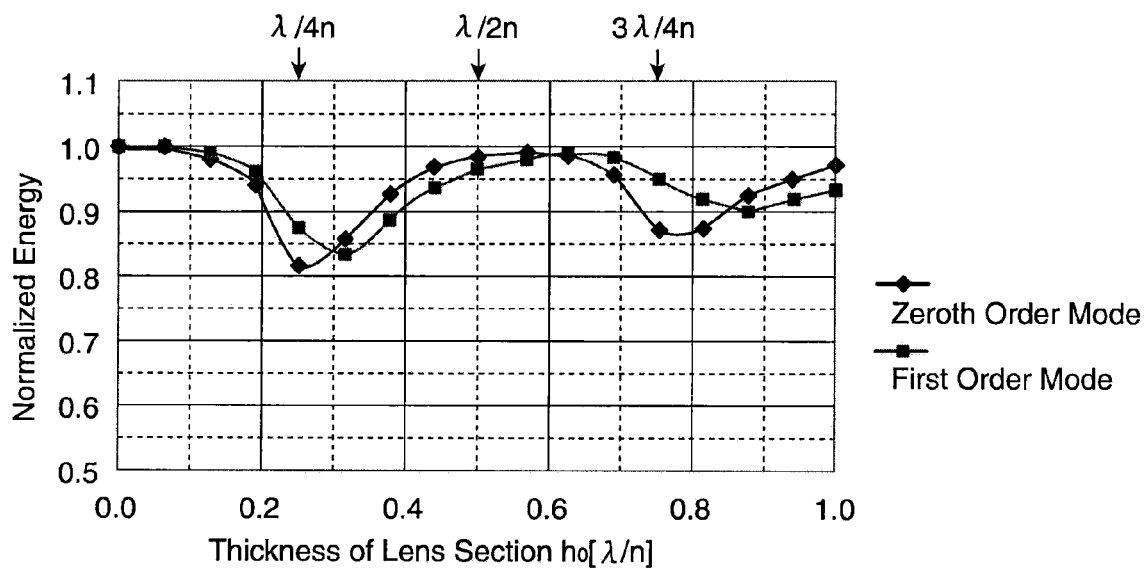
FIG. 5 is a graph showing the result of calculation of normalized energy in each mode with respect to the thickness of the lens section.
Figure 6:
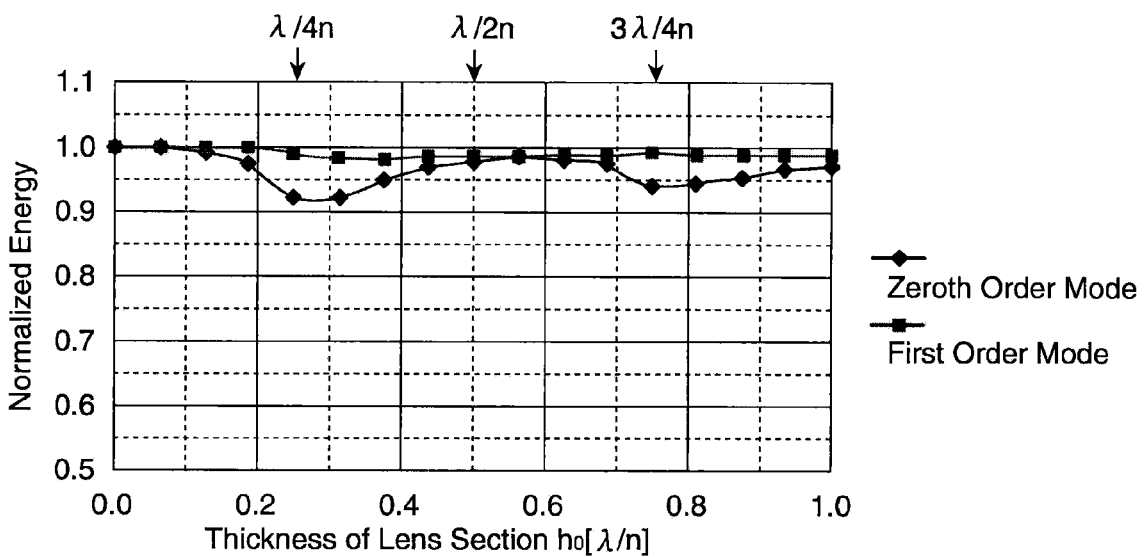
FIG. 6 is a graph showing the result of calculation of normalized energy in each mode with respect to the thickness of the lens section.

The radius a of the aperture section of the current constricting layer 105: 6.5 μm The design wavelength λ: 850 nm The calculation results are shown in FIG. 5 and FIG. 6. FIG. 5 shows the results when the outside diameter (radius) L of the plane configuration of the lens section 60 is 7.5 μm, and FIG. 6 shows the results when it is 2.5 μm. In this example, the cross-sectional shape of the lens section 60 was a circular arc, and the energy of the active layer in each mode was calculated while changing the thickness $h_0$ of the lens section 60 at its center. The thickness $h_0$ of the lens section 60 at its center is plotted along the axis of abscissas, and the normalized energy of the active layer is plotted along the axis of ordinates. As shown in FIG. 5 and FIG. 6, the zeroth order mode and the first order mode both have cyclical behavior with respect to the thickness $h_0$ of the lens section 60, regardless of the outside diameter of the lens section 60. In the zeroth order mode, the normalized energy of the active layer becomes greater when the thickness $h_0$ of the lens section 60 equals to an even multiple of $\lambda/4n$ (when the reflection power in the vertical direction is considered to be high). Further, the normalized energy of the active layer becomes smaller when the thickness $h_0$ of the lens section 60 equals to an odd multiple of $\lambda/4n$ (when the reflection power in the vertical direction is considered to be low). Also, when the thickness $h_0$ of the lens section 60 is made greater, the curvature of the lens section 60 becomes greater (its radius of curvature becomes smaller). However, it is observed that, the greater the curvature of the lens section 60, the smaller the difference between the maximum value and the minimum value of the normalized energy of the active layer for each mode becomes. This phenomenon is believed to occur as follows. When the curvature of the lens section 60 becomes greater, the rate of change in the thickness near the center of the lens section 60 is greater, and therefore the effect of the thickness $h_0$ of the lens section 60 near its center being fixed to an odd multiple or even multiple of $\lambda/4n$ would be diminished, and would act as an average thickness.

Also, as shown in FIG. 5 and FIG. 6, the cycle of the maximum value and the minimum value of the normalized energy of the active layer in the first order mode to the thickness $h_0$ of the lens section 60 is greater than the cycle of those in the zeroth order mode. It is believed that, as shown in FIG. 1, because the area where the first order mode exists is relatively outside compared to the zeroth order mode, the thickness $h_1$ of the lens section 60 (the thickness of the lens section at an anti-node of the first order mode) the first order mode mainly senses is smaller than the thickness $h_0$ at the center of the lens section. In other words, it is observed from FIG. 5 and FIG. 6 that, with respect to the first order mode, when the thickness $h_1$ of the lens section 60 at its anti-node is an even multiple of $\lambda/4n$, the normalized energy of the active layer becomes greater; and when it is an odd multiple of $\lambda/4n$, the normalized energy of the active layer becomes smaller.

Figure 7:
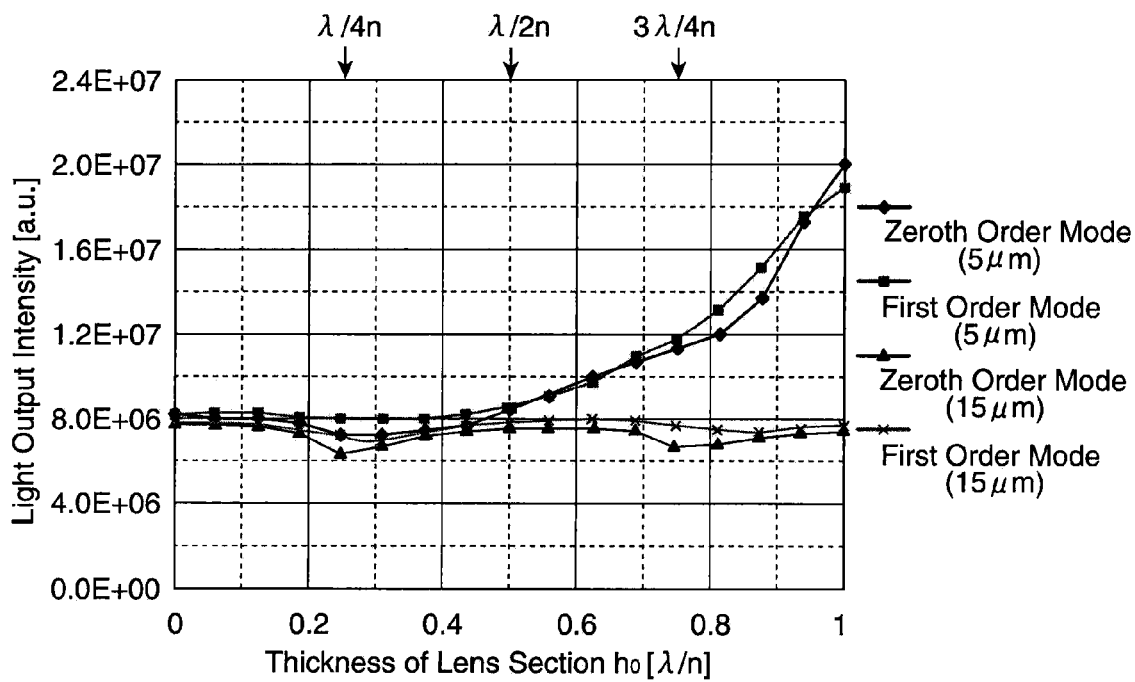
FIG. 7 is a graph showing the result of calculation of light output intensity in each mode in a downward direction with respect to the thickness of the lens section.

Next, FIG. 7 shows the relation of light output intensities in a downward direction with respect to the thickness $h_0$ of the lens section 60 (in a direction toward the side of the lower mirror 10 with the active layer 103 being as a reference). When the outside diameter L of the plane configuration of the lens section 60 is 2.5 μm, the thickness $h_0$ of the lens section 60 may be made greater (its curvature is made greater), thereby increasing light components diagonally reflected at the lens section 60, as shown in FIG. 7, the light output intensity in the downward direction increases. In other words, even when light is reflected diagonally, the light reaches the substrate 101 as it travels in directions different from the reflection direction of the DBR mirror. It is noted that, although light is finally absorbed by the substrate 101, the light output intensity is calculated, for computation, while much of the light does not enter the substrate 101.

In the surface-emitting laser 100 in accordance with the present embodiment, the thickness $h_0$ of the lens section 60 at an anti-node of the zeroth order mode is $\lambda/2n$, and the thickness $h_1$ of the lens section 60 at an anti-node of the first order mode is $\lambda/4n$. According to the surface-emitting laser 100, as shown in FIG. 5 and FIG. 6, the normalized energy of the active layer can be made greater in the zeroth order mode, and smaller in the first order mode. Further, as shown in FIG. 7, the light output intensity in the downward direction can be suppressed lower, compared to the case where the lens section 60 has a larger curvature.

Figure 8:
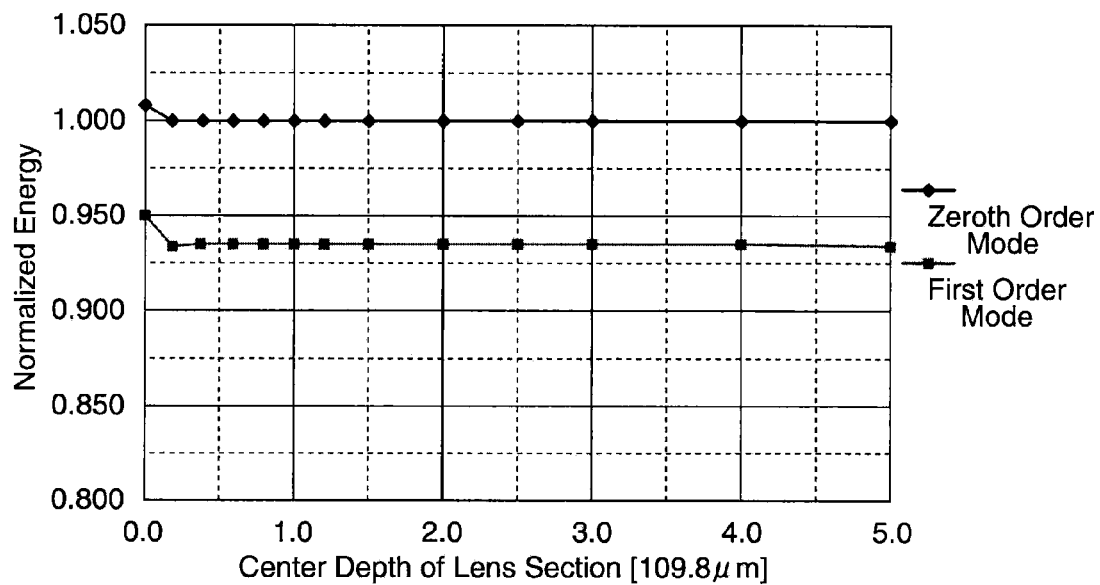
FIG. 8 is a graph showing the result of calculation of normalized energy in each mode with respect to the depth of the lens section at its center.

Next, FIG. 8 shows the relation between normalized energies of the active layer with respect to the center depth of the elliptic arc (including circular arc) in the cross-sectional shape of the upper surface of the lens section 60. The thickness $h_0$ of the lens section 60 at an anti-node of the zeroth order mode is $\lambda/2n$, and the thickness $h_1$ of the lens section 60 at an anti-node of the first order mode is $\lambda/4n$. Also, the center depth (the position at 109.8 μm from the upper surface of the upper mirror 20 in the downward direction) in the case of a circular arc (arc of a perfect circle) is set as a reference (1.0).

By the surface-emitting laser 100 in accordance with the present embodiment, the difference between the normalized energies of the active layer in the zeroth order mode and the first order mode could be set to about 7% or greater, regardless of the center depth of the elliptic arc. By this, the current value required for the first order mode to have a laser oscillation can be made greater, such that the surface-emitting laser 100 in accordance with the present embodiment can maintain a single mode up to a higher current value, compared with a surface-emitting laser having the same structure other than the lens section 60. Accordingly, the surface-emitting laser 100 in accordance with the present embodiment can achieve, for example, a single mode and a higher output. It is noted that, as shown in FIG. 8, the difference between the normalized energies of the active layer in the zeroth order mode and the first order mode has almost no change even when the center depth of the elliptic arc is changed. This is because the radius of curvature of the upper surface of the lens section 60 at an anti-node of the zeroth order mode remains almost at the same value as the radius of curvature of the upper surface of the lens section 60 at an anti-node of the first order mode.

4. Next, modified examples of the present embodiment are described. It is noted that features different from those of the embodiment example described above (hereafter referred to as the "example of surface-emitting laser 100") are described, and description of the same features is omitted.

(1) First, a first modified example is described.

In the present modified example, the refractive index $n_1$ of the topmost layer of the upper mirror 20 with respect to light with a designed wavelength $\lambda$ can be made smaller than the refractive index n of the lens section 60 with respect to the designed wavelength $\lambda$. In this case, the thickness $h_0$ of the lens section 60 at an anti-node of the zeroth order mode is $3\lambda/4n$, and the thickness $h_1$ of the lens section 60 at an anti-node of the first order mode is $\lambda/2n$.

(2) Next, a second modified example is described.

Figure 9:
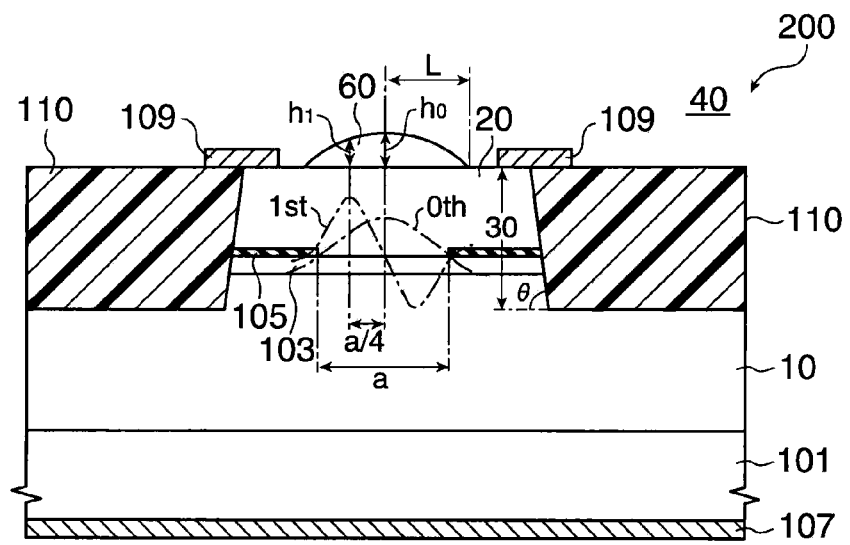
FIG. 9 is a schematic cross-sectional view of a surface-emitting laser in accordance with a modified example of the present embodiment.
Figure 10:
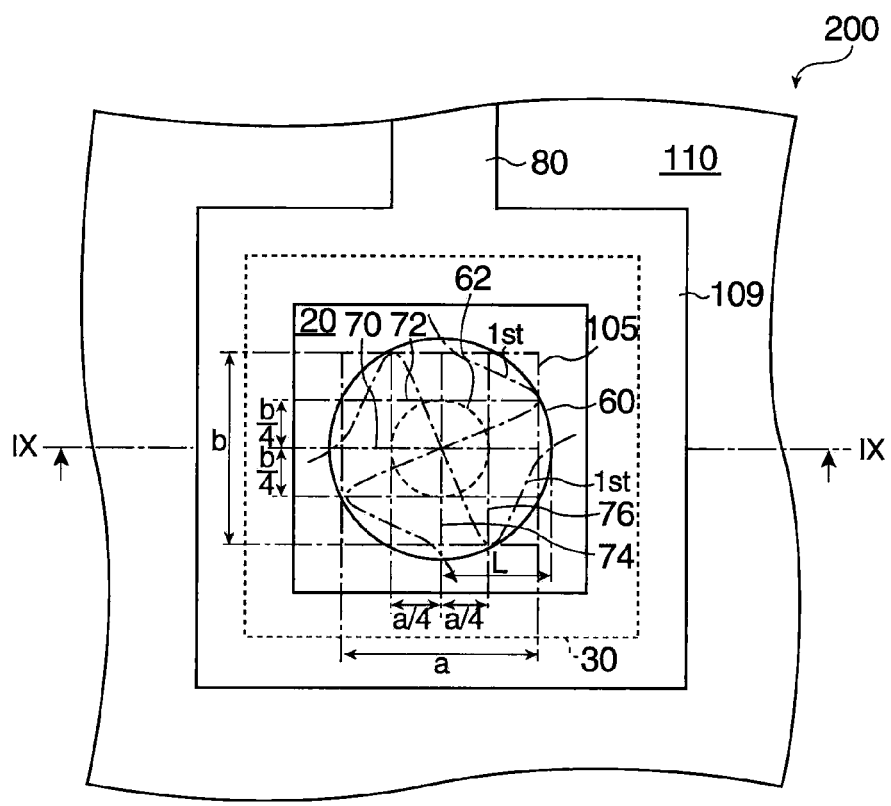
FIG. 10 is a schematic cross-sectional view of a surface-emitting laser in accordance with a modified example of the present embodiment.

FIG. 9 is a schematic cross-sectional view of a surface-emitting laser 200 in accordance with the present modified example, and FIG. 10 is a schematic plan view of the surface-emitting laser 200. It is noted that FIG. 9 is a cross-sectional view taken along lines IX-IX in FIG. 10.

In the present modified example, an aperture section of a current constricting layer 105 has a plane configuration that is a rectangular shape (including square and rectangle) concentric with a plane configuration of the lens section 60, and having a first side with a length a and a second side with a length b. The plane configuration of the lens section 60 may be, for example, a circular shape, an elliptical shape or a rectangular shape. In the illustrated example, the plane configuration of the aperture section of the current constricting layer 105 is square, and the lens section 60 has a plane configuration that is circle.

In the present embodiment, when the refractive index $n_1$ of the topmost layer of the upper mirror 20 is greater than the refractive index n of the lens section 60, the thickness $h_0$ of the lens section 60 at an anti-node of the zeroth order mode is $\lambda/2n$, and the thickness $h_1$ of the lens section 60 at at least a portion of an anti-node of the first order mode is $\lambda/4n$. Also, when the refractive index $n_1$ of the topmost layer of the upper mirror 20 is smaller than the refractive index n of the lens section 60, the thickness $h_0$ of the lens section 60 at an anti-node of the zeroth order mode is $3\lambda/4n$, and the thickness $h_1$ of the lens section 60 at at least a portion of an anti-node of the first order mode is $\lambda/2n$.

In the case of this modified example, as shown in FIG. 9 and FIG. 10, an anti-node of the zeroth order mode is located at the center of the plane configuration of the lens section 60. The electrical filed distribution of the first order mode forms a sine wave like a rectangular waveguide, and therefore its anti-node is present at a position 72 that is spaced a distance of b/4 from a center line 70 along the first side of the aperture section of the current constricting layer 105, and at a position 76 that is spaced a distance of a/4 from a center line 74 along the second side of the aperture section. FIG. 10 shows, for the sake of convenience, a contour line 62 of the thickness $h_1$ of the lens section 60 at at least a portion of the positions 72 and 76 at the anti-node of the first order mode. For example, in the example shown in FIG. 10, the lens 60 has a thickness $h_1$ at points where linear lines at the positions 72 and 76 where the anti-node of the first order mode exists intersect the center lines 70 and 74 of the aperture section of the current constricting layer 105. A plane configuration defined by the contour line of the thickness $h_1$ of the lens section 60 may be, for example, a circular shape, an elliptic shape or a rectangular, and is a circular shape in the illustrated example.

(3) Next, a third modified example is described.

In the example of surface-emitting laser 100, as a method for forming the lens section 60, a forming method in which, for example, a semiconductor layer is epitaxially grown and the semiconductor layer is patterned may be used. However, the lens section 60 may also be formed by a droplet ejection method such as an ink jet method, using, for example, a resin material.

(4) Next, a fourth modified example is described.

In the present modified example, for example, the substrate 101 of the surface-emitting laser may be separated by using, for example, an epitaxial lift-off (ELO) method or the like. In other words, the surface-emitting laser may be provided without the substrate 101.

It is noted that the modified examples described above are only examples, and the invention is not limited to these modified examples. For example, the modified examples can also be appropriately combined.

5. According to the surface-emitting lasers (including the modified examples) described above, the first order mode (high order mode) can be cut or reduced, and a higher output can be achieved. This is also confirmed by the numerical calculation examples described above. Also, by the surface-emitting lasers described above, the first mode can be cut or reduced, the emission angle of laser light emitted from the surface-emitting laser can be made narrower, compared to the case where the first mode is not cut or reduced.

6. Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

For example, the surface-emitting lasers in accordance with the present embodiment described above may be favorably used on various kinds of optical modules and optical transmission devices.

What is claimed is:

1. A surface-emitting type semiconductor laser comprising:

a lower mirror;

an active layer formed above the lower mirror;

an upper mirror formed above the active layer; and
a lens section formed above the upper mirror,
being $n_1 < n$, where $\lambda$ is a design wavelength, $n_1$ is a refractive index of a topmost layer of the upper mirror with respect to light of the design wavelength, and n is a refractive index of the lens section with respect to light of the design wavelength,
the lens section having a thickness of $3\lambda/4n$ at an anti-node of the zeroth order resonance mode component among light resonating in the active layer, and
the lens section having a thickness of $\lambda/2n$ at at least a portion of an anti-node of the first order resonance mode component among the light resonating in the active layer,
normalized energy of the active layer with the zeroth order resonance mode component being greater than normalized energy of the active layer with the first order resonance mode component.

* * * * *